United States Patent [19]
Ohsawa et al.

[11] Patent Number: 5,576,570
[45] Date of Patent: Nov. 19, 1996

[54] SEMICONDUCTOR DEVICE HAVING CMOS CIRCUIT

[75] Inventors: Nobuhiko Ohsawa; Shinichi Ito; Hideshi Abe, all of Kanagawa, Japan

[73] Assignee: Sony Corporation, Tokyo, Japan

[21] Appl. No.: 438,366

[22] Filed: May 10, 1995

Related U.S. Application Data

[63] Continuation of Ser. No. 291,496, Aug. 17, 1994, abandoned.

[30] Foreign Application Priority Data

Aug. 19, 1993 [JP] Japan .................................. 5-228298

[51] Int. Cl.$^6$ ........................... H01L 29/76; H01L 29/94; H01L 31/062; H01L 29/00
[52] U.S. Cl. ........................ 257/369; 257/371; 257/409; 257/500
[58] Field of Search ..................................... 257/369, 371, 257/372, 373, 374, 375, 376, 409, 500, 501

[56] References Cited

U.S. PATENT DOCUMENTS

| 5,105,252 | 4/1992 | Kim et al. | 257/370 |
| 5,239,197 | 8/1993 | Yamamoto | 257/369 |
| 5,386,135 | 1/1995 | Nakazato et al. | 257/369 |

*Primary Examiner*—Steven H. Loke
*Attorney, Agent, or Firm*—Hill, Steadman & Simpson

[57] ABSTRACT

Disclosed is a CMOS integrated circuit, in which a high voltage circuit with both positive and negative polarities and a large scale low voltage circuit are formed on the same chip. The high voltage circuit is composed of a CMOS circuit having an nMOS transistor formed on a p-type semiconducting substrate, and a pMOS transistor formed in an n-well formed on the p-type semiconducting substrate. The low voltage circuit is composed of a CMOS circuit having a pMOS transistor which is formed in an n-well formed on the p-type semiconducting substrate, and an nMOS transistor formed in a p-well formed in the n-well.

9 Claims, 4 Drawing Sheets

SEMICONDUCTOR DEVICE HAVING CMOS CIRCUIT

This is a continuation, of application Ser. No. 08/291,496, filed Aug. 17, 1994 now abandoned.

BACKGROUND OF THE INVENTION

1. Field of the Invention

The present invention relates to a complementary MOS (CMOS) integrated circuit, and particularly to a CMOS integrated circuit in which a high voltage CMOS circuit and a low voltage CMOS circuit are formed on a semiconducting substrate.

2. Description of the Related Art

A CMOS integrated circuit including a plurality of circuits (for example, a high voltage circuit and a low voltage circuit) operated by different power supply voltages has such a structure as shown, for example, in Japanese Patent Laid-open No. HEI 2-284462. In this structure, a semiconducting substrate employed is set at a reference potential; divided wells each having a conducting type different from that of the semiconducting substrate are provided within the same plane region; and CMOS transistors are respectively formed in the divided wells, to constitute respective circuits, thus separating the power supply voltages of the circuits from each other.

The related art CMOS integrated circuit having the above structure, however, is disadvantageous in that the potential of the above well can be set at either positive or negative with respect to the reference potential depending on the conducting type of the semiconducting substrate. This makes it impossible to provide the circuit processing signals with both positive and negative polarities relative to the reference potential.

For this reason, in a system requiring a low voltage logic circuit and a circuit for outputting signals with both positive and negative polarities (for example, a CCD camera system or digital communication interface), the reference potentials are separately set on different chips, thereby causing a problem in making it difficult to achieve miniaturization by use of only one chip.

OBJECT AND SUMMARY OF THE INVENTION

An object of the present invention is to provide a CMOS integrated circuit in which a high voltage circuit with both positive and negative polarities and a large scale low voltage circuit are formed on the same chip.

To achieve the above object, according to the present invention, there is provided a CMOS integrated circuit, in which a high voltage CMOS circuit and a low voltage CMOS circuit are formed on a semiconducting substrate having a first conducting type, including: a high voltage CMOS circuit including a first MOS transistor having a second conducting type which is formed on the semiconducting substrate, and a second MOS transistor having the first conducting type which is formed in a first well having the second conducting type formed on the semiconducting substrate; and a low voltage CMOS circuit including a third MOS transistor having the first conducting type which is formed in a second well having the second conducting type formed on the semiconducting substrate, and a fourth MOS transistor having the second conducting type which is formed in a third well having the first conducting type formed in the second well having the second conducting type.

In the CMOS integrated circuit having the above structure, a high voltage CMOS circuit is directly formed on a semiconducting substrate, and a low voltage CMOS circuit is formed on a well, the well being formed on the semiconducting substrate and having a conducting type different from that of the semiconducting substrate, thereby separating the low voltage CMOS circuit from the semiconducting substrate in terms of potential.

With this structure, the positive power supply voltage and the negative power supply voltage of the low voltage CMOS circuit can be set to be independent from either of the positive power supply voltage and the negative power supply voltage of the high voltage CMOS circuit. As a result, the low voltage CMOS circuit and the high voltage CMOS circuit can be formed on the same chip.

DETAILED DESCRIPTION OF THE PREFERRED EMBODIMENTS

Hereinafter, embodiments of the present invention will be described with reference to the drawings.

Figure 1:
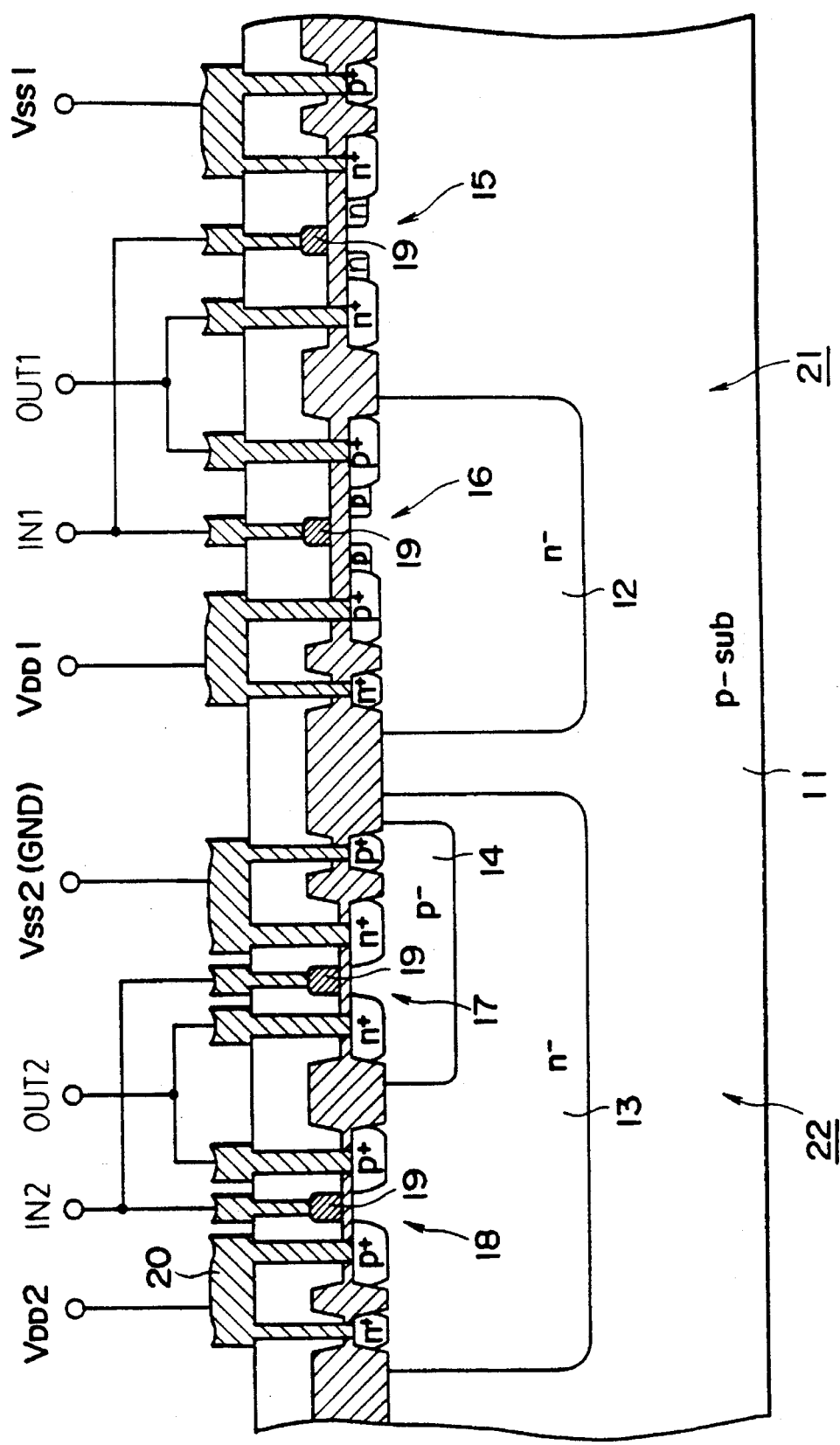
FIG. 1 is a sectional view showing the structure using a p-type semiconducting substrate according to a first embodiment of the present invention.

FIG. 1 is a sectional view showing the structure of a first embodiment of a CMOS integrated circuit formed on a p-type semiconducting substrate according to the present invention.

In FIG. 1, a p-type semiconducting substrate 11 is biased with a negative power supply potential $V_{SS}1$. A first n-well 12 is formed on the p-type semiconducting substrate 11. The first n-well 12 is biased with a high positive power supply voltage $V_{DD}1$.

A second n-well 13 is formed on the p-type semiconducting substrate 11 separated from the first n-well 12 within the same plane region. The second n-well 13 is biased with a low positive power supply voltage $V_{DD}2$. Namely, $V_{DD}1$ is set to be higher than $V_{DD}2$. The first n-well 12 and the second n-well 13 are formed by the same ion implantation and the same drive-in process.

A p-well 14 is formed on the p-type semiconducting substrate 11 in a manner to be contained in the plane region of the second n-well 13. The p-well 14 is biased with a power supply voltage $V_{SS}2$, for example, the grounding (GND) potential.

An nMOS transistor (first MOS transistor) 15 is formed on the p-type semiconducting substrate 11, and a pMOS transistor (second MOS transistor) 16 is formed in the first n-well 12. In these MOS transistors 15 and 16, the gates and drains are respectively common to each other, thus forming the so-called CMOS circuit. The CMOS circuit is used as a high voltage circuit 21 processing high voltages with positive and negative polarities.

An nMOS transistor (fourth MOS transistor) 17 is formed in the p-well 14, and a pMOS transistor (third MOS transistor) 18 is formed in the second n-well 13. In these MOS transistors 17 and 18, the gates and drains are respectively common to each other, thus forming the so-called CMOS circuit. The CMOS circuit is used as a low voltage circuit 22 processing a low voltage with a positive polarity.

In FIG. 1, numeral 19 indicates a gate electrode of each MOS transistor, and 20 is an aluminum (Al) wiring.

As described above, by directly forming the high voltage circuit 21 on the p-type semiconducting substrate 11, and also forming the low voltage circuit 22 in the n-well 13 formed on the p-type semiconducting substrate 11, the low voltage circuit 22 can be separated from the semiconducting substrate 11 in terms of potential by the presence of the well 13, thus making it possible to set the positive power supply voltage $V_{DD}2$ and the negative power supply voltage $V_{SS}2$ of the low voltage circuit 22 independently from either of the positive power supply voltage $V_{DD}1$ and the negative power supply voltage $V_{SS}1$ of the high voltage circuit 21.

As a result, the high voltage circuit 21 and the low voltage circuit 22 can be formed as CMOS circuits on the same chip.

Moreover, by forming the CMOS circuit constituting the high voltage circuit 21 on the p-type semiconducting substrate 11, the enhancement in the breakdown voltage of the drain-substrate capacity, which is required for the increased withstanding voltage of MOSFETs, can be easily achieved because the concentration of the substrate can be sufficiently lowered.

Since both the n-well 12 of the high voltage circuit 21 and the n-well 13 for separating the low voltage circuit 22 from the bias of the p-type semiconducting substrate 11 are formed by the same ion implantation and the same drive-in process, the number of processes is only required to be increased slightly more than that of the usual processes of a high withstanding voltage CMOS.

With this structure, it is not required to make even the reference potentials between the circuits operate with different power supply voltages; accordingly, a logic circuit with an amplitude of 5 V as the low voltage circuit 22 can be operated using the power supply voltages of +5 V/0 V by setting the reference potential at the GND level, thus making the interface with the exterior easy.

Conventionally, in view of the interface with the exterior, when the high voltage circuit 21 has, for example power supply voltages of +15 V/−9 V, the control circuit in the preceding stage must be formed of a circuit with operation voltages of +5 V/−9 V because the reference potentials of both circuits must be made even.

However, the above structure enables a circuit with operating voltages of +5 V/0 V; accordingly, an FET with a low withstanding voltage can be used, thus making it possible to realize low power consumption and large scale integration.

Figure 2:
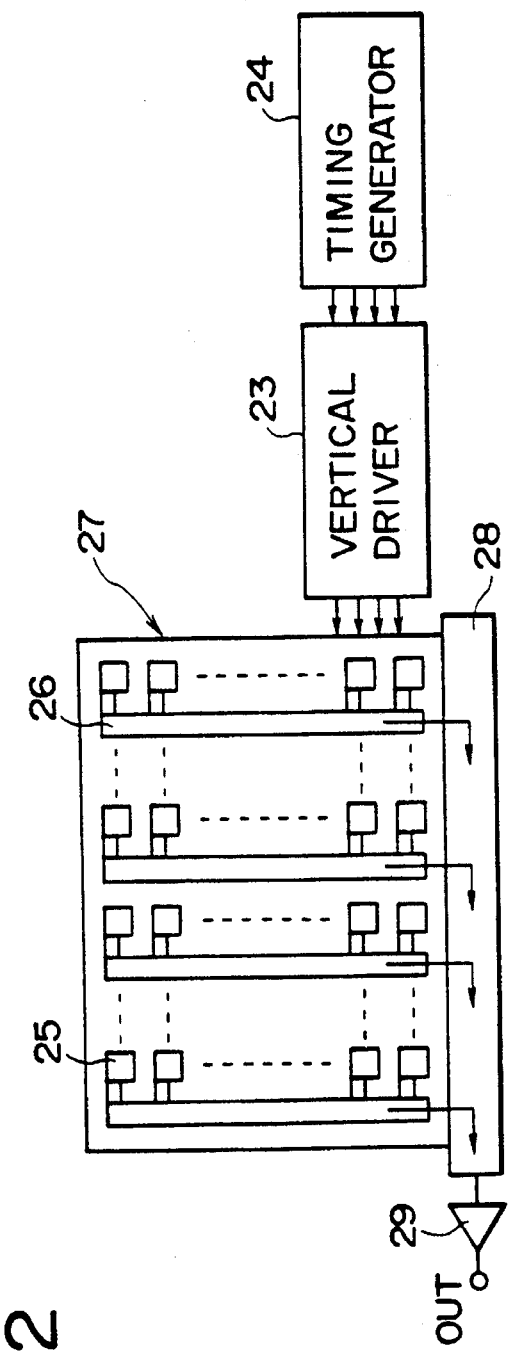
FIG. 2 is a view showing an example of a CCD solid camera device according to a second embodiment of the present invention.

In a CCD solid camera device shown in FIG. 2 according to a second embodiment of the present invention, the high voltage circuit 21 and the low voltage circuit 22 having the above structure are used as a high withstanding voltage vertical driver 23 and a low voltage timing generator 24 for driving the CCD, respectively.

In FIG. 2, the CCD solid state camera device includes a camera portion 27 having a plurality of photosensors 25 which are two-dimensionally arranged in a matrix and vertical registers 26 each being arranged for each vertical array of the photosensors 25 for vertically transmitting signal charges read from the photosensors 25; a horizontal register 28 for horizontally transmitting signal charges transmitted from the vertical registers 26; and a charge detecting portion 29 for detecting the signal charge transmitted from the horizontal resister 28 and converting it into a signal voltage. The vertical registers 26 are driven by the vertical driver 23.

Figure 3:
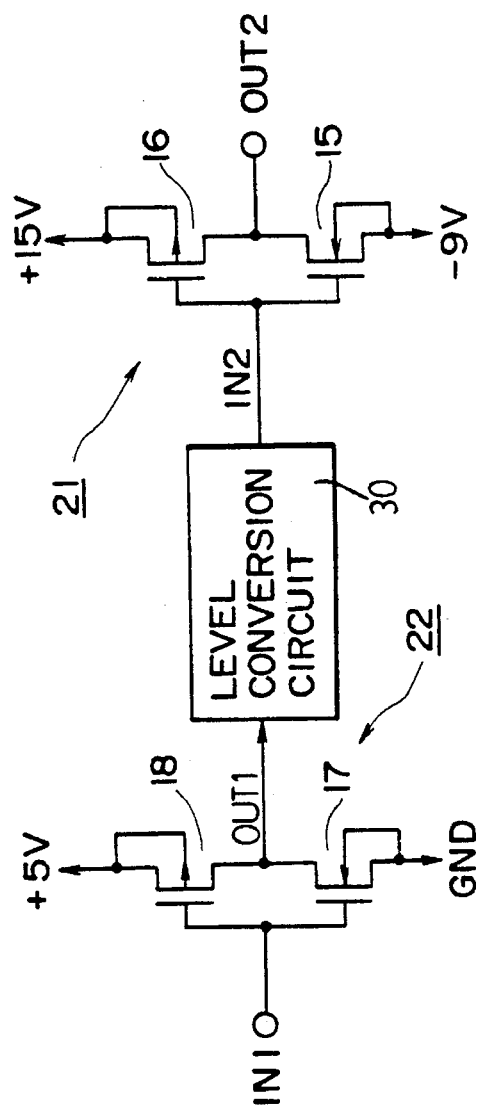
FIG. 3 is a circuit diagram showing an example of a circuit according to a third embodiment of the present invention.

FIG. 3 is a circuit diagram showing the high voltage circuit 21 and the low voltage circuit 22 which are applied to a vertical driver 23 and a timing generator 24 of the CCD solid camera device according to a third embodiment of the present invention.

In FIG. 3, a power supply voltage $V_{SS}1$ on the low level side of a CMOS circuit composed of an nMOS transistor 15 and a pMOS transistor 16 as the high voltage circuit 21 becomes the reference potential of the vertical driver 23, which is set at for example −9 V; and a power supply voltage $V_{DD}1$ on the high level side becomes the positive power supply voltage of the vertical driver 23, which is set at, for example, +15 V.

On the other hand, a power supply voltage $V_{SS}2$ on the low level side of a CMOS circuit composed of an nMOS transistor 17 and a pMOS transistor 18 as the low voltage circuit 22 becomes the negative power supply voltage of the timing generator 24, which is set at the GND level; and a power supply voltage $V_{DD}2$ on the high level side becomes the reference potential of the timing generator 24, which is set at, for example +5 V.

Thus, by applying the high voltage circuit 21 and the low voltage circuit 22 to the vertical driver 23 and the timing generator 24 of the CCD solid camera device, and as shown in FIG. 1, separating the timing generator 24 as the low voltage circuit 22 from the p-type semiconducting substrate 11 by the presence of the n-well 13 in terms of the potential, the reference potential and the negative power supply voltage of the timing generator 24 can be set independently from either of the positive power supply voltage and the reference potential of the vertical driver 23 of the high voltage circuit 21.

Accordingly, the timing generator 24 operated with an amplitude of 5 V/0 V and the vertical driver 23 for generating an output signal with an amplitude of +15 V/−9 V can be formed of the CMOS circuits on the same chip.

A level conversion circuit 30 for converting the signal level is disposed between the low voltage circuit 22 and the high voltage circuit 21.

Figure 4:
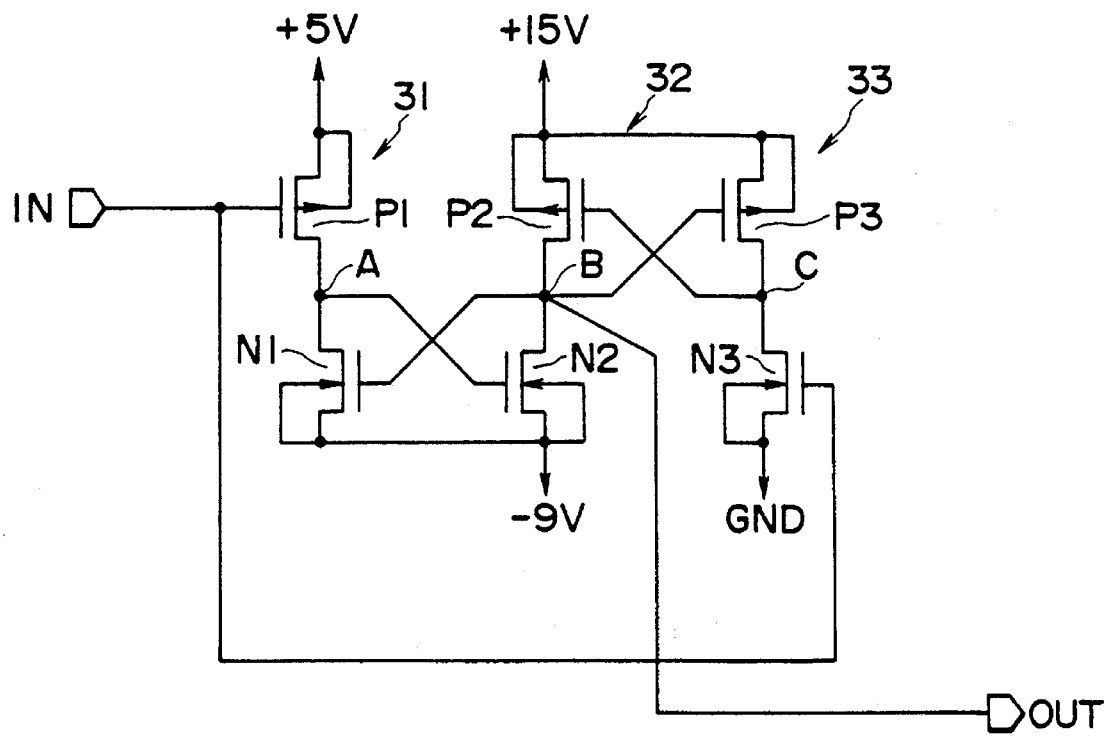
FIG. 4 is a circuit diagram showing an example of a level conversion circuit according to a fourth embodiment of the present invention.

As shown in FIG. 4, the level conversion circuit 30 according to a fourth embodiment of the present invention includes a first CMOS circuit 31 having a pMOS transistor P1 and an nMOS transistor N1 pair in which the drains are common to each other; a similar second CMOS circuit 32 having a pMOS transistor P2 and an nMOS transistor N2 pair; and a similar third CMOS circuit 33 having a pMOS transistor P3 and an nMOS transistor N3 pair.

The source of the pMOS transistor P1 of the first CMOS circuit 31 is biased with +5 V, which is the positive power supply voltage of the low voltage circuit 22. The respective sources of the nMOS transistors N1 and N2 of the first and second CMOS circuits 31 and 32 are commonly connected to each other and are biased with −9 V, which is the negative power supply voltage of the high voltage circuit 21.

The drain common connection A between the pMOS transistor P1 and the nMOS transistor N1 of the first CMOS circuit 31 is connected to the gate of the nMOS transistor N2 of the second CMOS circuit 32. The drain common connection B between the pMOS transistor P2 and the nMOS transistor N2 of the second CMOS circuit 32 is connected to the gate of the nMOS transistor N1 of the first CMOS circuit 31.

The respective sources of the pMOS transistors P2 and P3 of the second and third CMOS circuits 32 and 33 are commonly connected to each other, and are biased with +15 V, which is the positive power supply voltage of the high voltage circuit 21. The source of the nMOS transistor N3 of the third CMOS circuit 33 is biased with the ground potential (0 V), which is the negative power supply voltage of the low voltage circuit 22.

The drain common connection B between the pMOS transistor P2 and the nMOS transistor N2 of the second CMOS circuit 32 is connected to the gate of the pMOS transistor P3 of the third CMOS circuit 33. The drain common connection C between the pMOS transistor P3 and the nMOS transistor N3 of the third CMOS circuit 33 is connected to the gate of the pMOS transistor P2 of the second CMOS circuit 32.

The gate of the pMOS transistor P1 of the first CMOS circuit 31 is commonly connected to the gate of the nMOS transistor N3 of the third CMOS circuit 33, which becomes a circuit input IN. The drain common connection between the pMOS transistor P2 and the nMOS transistor N2 of the second CMOS circuit 32 becomes the circuit output OUT.

An output signal of the low voltage circuit 22 (in this embodiment, the timing generator 24) is input to each gate of the pMOS transistor P1 and the nMOS transistor N3. A signal converted in level is introduced from the drain common connection B between the pMOS transistor P2 and the nMOS transistor N2, and the output signal is supplied to the high voltage circuit 21 (in this embodiment, the vertical driver 23).

Figure 5:
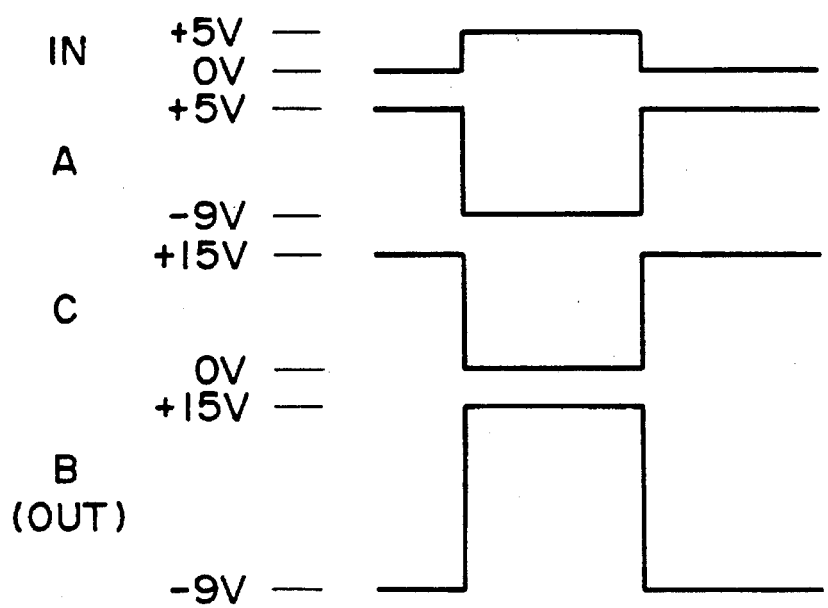
FIG. 5 is a timing chart for explaining the operation of the level conversion circuit.

Next, the operation of the level conversion circuit 30 will be described with reference to the timing chart of FIGS. 5.

When a low level output (in this embodiment, 0 V) of the timing generator 24 is applied to each gate of the pMOS transistor P1 of the first CMOS circuit 31 and the nMOS transistor N3 of the third CMOS circuit 33, the pMOS transistor P1 of the first CMOS circuit 31 becomes on, and the potential of the point A becomes +5 V. Thus, the nMOS transistor N2 of the second CMOS circuit 32 becomes on.

Accordingly, the potential of the point B becomes −9 V, and the nMOS transistor N1 of the first CMOS circuit 31 becomes off; however, since the pMOS transistor P3 of the third CMOS circuit 33 becomes on, the potential of the point C becomes +15 V. Thus, the pMOS transistor P2 of the second CMOS circuit 32 becomes off, and the potential of the point B, being the circuit output OUT, is kept at −9 V.

On the other hand, when a high level output (in this embodiment, +5 V) of the timing generator 24 is applied to each gate of the pMOS transistor P1 of the first CMOS circuit 31 and the nMOS transistor N3 of the third CMOS circuit 33, the pMOS transistor P1 of the first CMOS circuit 31 becomes off; however, since the nMOS transistor N3 of the third CMOS circuit 33 becomes on, the potential of the point C becomes 0 V, and the pMOS transistor P2 of the second CMOS circuit 32 becomes on.

Accordingly, the point B becomes +15 V, and the pMOS transistor P3 of the third CMOS circuit 33 becomes off; however, since the nMOS transistor N1 of the first CMOS circuit 31 becomes on, the potential of the point A becomes −9 V, and the nMOS transistor N2 of the second CMOS circuit 32 becomes off. Thus, the potential of the point B, being the circuit output terminal, is kept at +15 V.

In the above embodiment, there has been described the example in which the high voltage circuit 21 and the low voltage circuit 22 are applied to the vertical driver 23 and the timing generator 24 of the CCD solid camera device; however, the present invention is not limited thereto and may be applied to a digital communication interface and the like.

In the above embodiment, the CMOS circuit is formed on the p-type semiconducting substrate; however, it may be applied on the n-type semiconducting substrate with the same effect.

Figure 6:
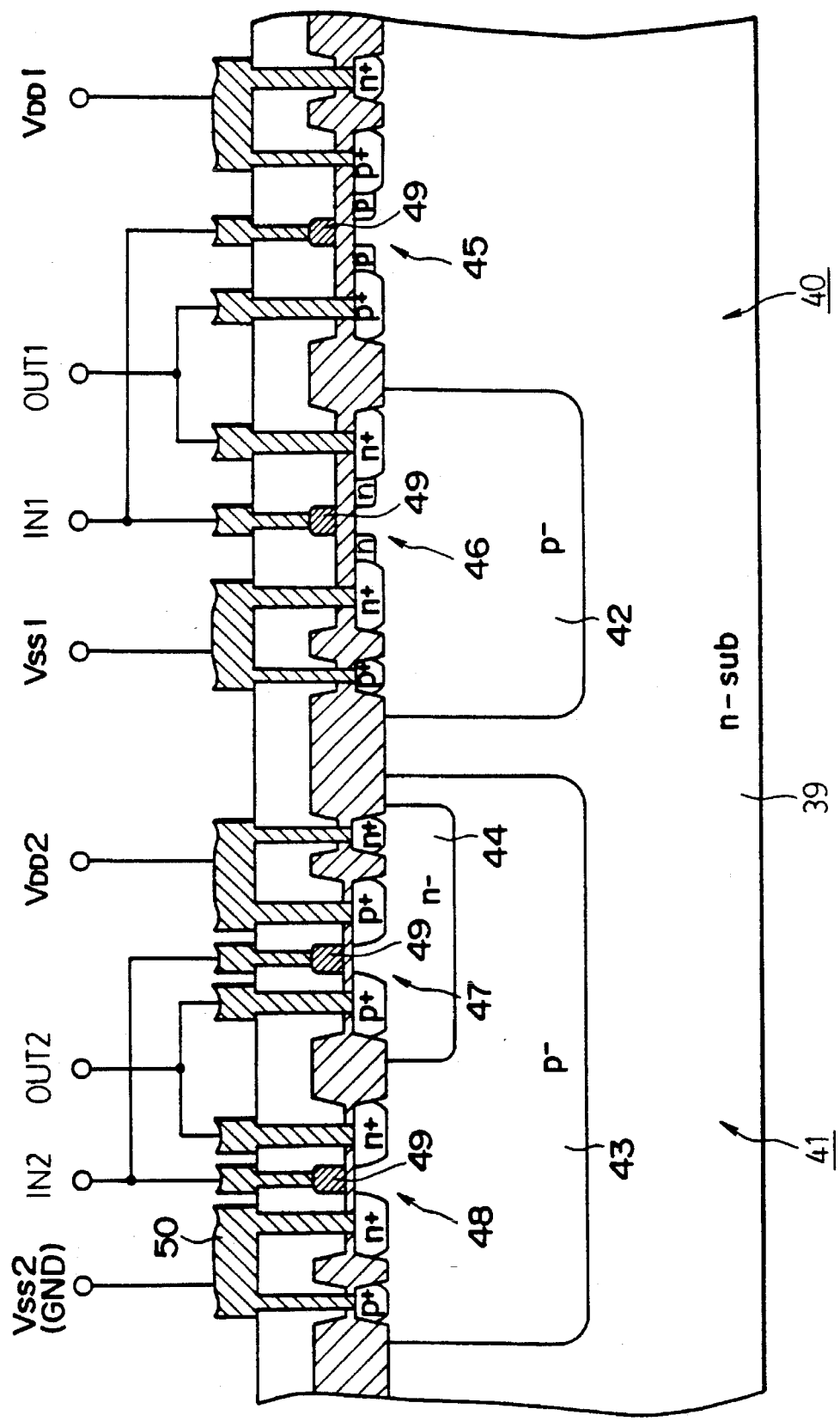
FIG. 6 is a sectional view showing the structure using an n-type semiconducting substrate according to a fifth embodiment of the present invention.

FIG. 6 is a sectional view showing the structure using an n-type semiconducting substrate according to a fifth embodiment of the present invention.

In FIG. 6, an n-type semiconducting substrate 39 is biased with a high positive power supply voltage $V_{DD}1$. A first p-well 42 is formed on the n-type semiconducting substrate 39. The first p-well 42 is biased with a negative power supply voltage $V_{SS}1$.

A second p-well 43 is formed on the n-type semiconducting substrate 39 separated from the first p-well 42 within the same plane region. The second p-well 43 is biased with a power supply voltage $V_{SS}2$, for example, the GND level. The first p-well 42 and the second p-well 43 are formed by the same ion implantation and the same drive-in process.

An n-well 44 is formed on the n-type semiconducting substrate 39 in the second p-well 43 so as to be contained within the same plane region. The n-well 44 is biased with a low positive power supply voltage $V_{DD}2$.

A pMOS transistor (first MOS transistor) 45 is formed on the n-type semiconducting substrate 39, and an nMOS transistor 46 (second MOS transistor) is formed in the first p-well 42. In these transistors 45 and 46, the gates and drains are respectively common to each other, thus forming the CMOS circuit. The CMOS circuit is used as a high voltage circuit 40 processing high voltages with both positive and negative polarities.

The pMOS transistor (fourth MOS transistor) 47 is formed in the n-well 44, and the nMOS transistor (third transistor) 48 is formed in the second p-well 43. In these transistors 47 and 48, the gates and drains are respectively common to each other, thus forming the CMOS circuit. The CMOS circuit is used as a low voltage circuit 41 processing a low voltage of a positive polarity.

In addition, in FIG. 6, numeral 49 indicates a gate electrode of each MOS transistor and 50 is an Al wiring.

Although various minor changes and modifications might be proposed by those skilled in the art, it will be understood that we wish to include within the claims of the patent warranted hereon all such changes and modifications as reasonably come within our contribution to the art.

What is claimed is:

1. A CMOS integrated circuit, comprising:
   a semiconductor substrate of first conductivity type having formed therein a first CMOS circuit and a second CMOS circuit;
   said first CMOS circuit comprising a first well of second conductivity type formed in said semiconductor substrate, a first MOS transistor of second conductivity type having second conductivity type source and drain regions formed in said substrate, and a second MOS transistor of first conductivity type having first conductivity type source and drain regions formed in said first well and directly adjacent said first transistor outside of said first well;

said second CMOS circuit comprising a second well of second conductivity type formed in said semiconductor substrate, a third well of first conductivity type formed in said second well, a third MOS transistor of first conductivity type having first conductivity type source and drain regions formed in said second well, and a fourth MOS transistor of second conductivity type having second conductivity type source and drain regions formed in said third well;

said first well lying directly adjacent said second well without any MOS transistor therebetween, and said first well lying between said first MOS transistor and said second well;

a gate of the first MOS transistor being connected to a gate of the second MOS transistor, one end of each channel of the first and second MOS transistors being connected via respective drain regions, gates of said third and fourth MOS transistors being connected, and one end of each channel of said third and fourth MOS transistors being connected via respective drain regions; and the first and second MOS transistors of the first CMOS circuit being connected in series between a relatively high positive voltage and a negative voltage, and the third and fourth MOS transistors of the second CMOS circuit being connected in series between a relatively low positive voltage lower than said high positive voltage and a reference potential higher than said negative voltage.

2. A CMOS integrated circuit, comprising:

a semiconductor substrate of first conductivity type having formed therein a high voltage CMOS circuit and a low voltage CMOS circuit;

said high voltage CMOS circuit comprising a first well of second conductivity type formed in said semiconductor substrate, a first MOS transistor of second conductivity type having second conductivity type source and drain regions formed in said substrate, and a second MOS transistor of first conductivity type having first conductivity type source and drain regions formed in said first well and directly adjacent said first transistor outside of said first well;

said low voltage CMOS circuit comprising a second well of second conductivity type formed in said semiconductor substrate, a third well of first conductivity type formed in said second well, a third MOS transistor of first conductivity type having first conductivity type source and drain regions formed in said second well, and a fourth MOS transistor of second conductivity type having second conductivity type source and drain regions formed in said third well;

said first well lying directly adjacent said second well without any MOS transistor therebetween, and said first well lying between said first MOS transistor and said second well;

a gate of the first MOS transistor being connected to a gate of the second MOS transistor, one end of each channel of the first and second MOS transistors being connected to each other via respective drain regions, gates of said third and fourth MOS transistors being connected, and the end of each channel of said third and fourth MOS transistors being connected to each other via respective drain regions; and the first and second MOS transistors of the high voltage CMOS circuit being connected in series between a relatively high positive voltage and a negative voltage, and the third and fourth MOS transistors of the low voltage CMOS circuit being connected in series between a relatively low positive voltage lower than said high positive voltage and a reference potential higher than said negative voltage.

3. A CMOS integrated circuit according to claim 2 wherein said first conductivity type comprises p-type conductivity and said second conductivity type comprises n-type conductivity.

4. A CMOS integrated circuit according to claim 2 wherein said high voltage CMOS circuit comprises a driver circuit of a solid state camera device.

5. A CMOS integrated circuit according to claim 2 wherein said low voltage CMOS circuit comprises a timing generator circuit of a solid state camera deice.

6. A CMOS integrated circuit according to claim 2 wherein within said high voltage CMOS circuit, said connected gates of said first and second MOS transistors being a first input and a first terminal between said connected channels of said first and second MOS transistors being a first output, and wherein within said low voltage CMOS circuit, said connected gates of said third and fourth MOS transistors being a second input and a second terminal between said connected channels of said third and fourth MOS transistors being a second output.

7. A CMOS integrated circuit, comprising:

a semiconductor substrate of first conductivity type having formed therein a high voltage CMOS circuit and a low voltage CMOS circuit;

said high voltage CMOS circuit comprising a first well of second conductivity type formed in said semiconductor substrate, a first MOS transistor of second conductivity type having second conductivity type source and drain regions formed in said substrate, and a second MOS transistor of first conductivity type having first conductivity type source and drain regions formed in said first well;

said low voltage CMOS circuit comprising a second well of second conductivity type formed in said semiconductor substrate, a third well of first conductivity type formed in said second well, a third MOS transistor of first conductivity type having first conductivity type source and drain regions formed in said second well, and a fourth MOS transistor of second conductivity type having second conductivity type source and drain regions formed in said third well;

a gate of the first MOS transistor being connected to a gate of the second MOS transistor and to a first terminal as the first input, one end of each channel of the first and second MOS transistors being connected to each other via respective drain regions and to a second terminal as a first output, gates of said third and fourth MOS transistors being connected to a third terminal as a second input, and one end of each channel of said third and fourth MOS transistors being connected to each other via respective drain regions and to a fourth terminal as a second output, and wherein in said high voltage circuit, said first MOS transistor has the other end of its channel connected via its source region to a negative voltage and said second MOS transistor has the other end of its channel connected via its source region to a high positive voltage, and said low voltage circuit has the other end of the channel of its third MOS transistor connected via its source region to an intermediate positive voltage lower than said high positive voltage, and the other end of the channel of its fourth MOS transistor connected via its source region to a voltage between said intermediate positive voltage and said negative voltage; and said first well lying between said first MOS transistor and said second well, and wherein said first and second wells are directly adjacent one another without any MOS transistor therebetween.

8. A CMOS integrated circuit, comprising:

a semiconductor substrate of first conductivity type having formed therein a first CMOS circuit and a second CMOS circuit;

said first CMOS circuit comprising a first well of second conductivity type formed in said semiconductor substrate, a first MOS transistor of second conductivity type having second conductivity type source and drain regions formed in said substrate, and a second MOS transistor of first conductivity type having first conductivity type source and drain regions formed in said first well and directly adjacent said first transistor outside of said first well;

said second CMOS circuit comprising a second well of second conductivity type formed in said semiconductor substrate, a third well of first conductivity type formed in said second well, a third MOS transistor of first conductivity type having first conductivity type source and drain regions formed in said second well, and a fourth MOS transistor of second conductivity type having second conductivity type source and drain regions formed in said third well;

said first well lying directly adjacent said second well without any MOS transistor therebetween, and said first well lying between said first MOS transistor and said second well;

a gate of the first MOS transistor being connected to a gate of the second MOS transistor, one end of each channel of the first and second MOS transistors being connected via respective drain regions, gates of said third and fourth MOS transistors being connected, and one end of each channel of said third and fourth MOS transistors being connected via respective drain regions;

the connection of the channels of the third and fourth MOS transistors being connected as an input to a level conversion circuit, and an output of the level conversion circuit connecting to the connected gates of the first and second MOS transistors; and the first and second MOS transistors of the first CMOS circuit being connected in series between a first positive voltage and a negative voltage, and the third and fourth MOS transistors of the second CMOS circuit being connected in series between a second positive voltage lower than said first positive voltage and a reference potential higher than said negative voltage.

9. A CMOS integrated circuit according to claim 8 wherein said level conversion circuit comprises:

fifth, sixth, seventh, eighth, ninth, and tenth MOS transistors; and a gate of the fifth MOS transistor of the level conversion circuit being connected to a common connection of one end of each channel of the seventh and eighth MOS transistors, a gate of the eighth MOS transistor of the level conversion circuit connecting to a common connection of one end of each channel of the fifth and sixth MOS transistors, a gate of the seventh MOS transistor of the level conversion circuit being said input of the level conversion circuit and the common connection of the channels of the fifth and sixth MOS transistors being said output of the level conversion circuit, said ninth and tenth MOS transistors of the level conversion circuit being connected in series between the other end of the channel of the sixth MOS transistor and said reference potential, a gate of the ninth MOS transistor connecting to the common connection of the channels of the fifth and sixth MOS transistors, a gate of the sixth MOS transistor connecting to a common connection of one end of each of the channels of the ninth and tenth MOS transistors, a gate of the tenth MOS transistor connecting to said input, said seventh and eighth MOS transistors being connected in series between said second positive potential voltage and said negative voltage, and said fifth and sixth MOS transistors being connected between said first positive voltage and said negative voltage.

* * * * *